United States Patent [19]
Tanabe et al.

[11] Patent Number: 5,381,176
[45] Date of Patent: Jan. 10, 1995

[54] MINIATURIZED VIDEO CAMERA

[75] Inventors: Ikuo Tanabe; Yoshinori Yoshida; Kiyoshi Seitoh, all of Kanagawa; Masanobu Morioka, Tokyo, all of Japan

[73] Assignee: Sony Corporation, Tokyo, Japan

[21] Appl. No.: 971,330

[22] Filed: Nov. 4, 1992

[30] Foreign Application Priority Data

Aug. 11, 1991 [JP] Japan .................................. 3-293461
Nov. 11, 1991 [JP] Japan .................................. 3-294312

[51] Int. Cl.⁶ .......................................... H04N 5/225
[52] U.S. Cl. .................................... 348/273; 348/274
[58] Field of Search ............... 358/209, 229, 909, 906; 354/74, 81; 361/749, 789; 348/207, 372, 373, 374, 375, 376, 143, 169; H04N 5/225

[56] References Cited

U.S. PATENT DOCUMENTS

| | | |
|---|---|---|
| 4,005,263 | 1/1977 | Collet . |
| 4,394,692 | 7/1983 | Randmae et al. .................... 358/229 |
| 4,400,858 | 8/1983 | Goiffon et al. . |
| 4,831,458 | 5/1989 | Takamura ............................. 358/229 |
| 4,855,838 | 8/1989 | Jones et al. ........................... 358/229 |
| 5,005,948 | 4/1991 | Takahashi et al. . |
| 5,221,964 | 6/1993 | Chamberlain et al. .............. 358/229 |

FOREIGN PATENT DOCUMENTS

| | | | |
|---|---|---|---|
| 0146644 | 7/1985 | European Pat. Off. ..... | H04N 5/225 |
| 0297793 | 1/1989 | European Pat. Off. ....... | H05K 7/20 |
| 2836092 | 2/1980 | Germany . | |
| 145361 | 12/1980 | Germany . | |
| 3622843 | 2/1987 | Germany ...................... | H04N 5/225 |
| 60-33785 | 2/1985 | Japan ............................ | H04N 5/335 |
| 63-27168 | 2/1988 | Japan ............................ | H04N 5/225 |
| 4-71078 | 6/1992 | Japan ............................ | H04N 5/225 |

Primary Examiner—Joseph Mancuso
Assistant Examiner—Tuan V. Ho
Attorney, Agent, or Firm—William S. Frommer; Alvin Sinderbrand

[57] ABSTRACT

In a miniature or small-sized video camera, a front block assembly including an image pick-up element and a rear block assembly are respectively secured within opposed open ends of a tubular outer casing, and a base plate assembly is disposed within the casing between the front and rear block assemblies and includes a plurality of elongated base plates arranged in longitudinally overlapped folded relation and having electronic elements or components mounted thereon and included in an electrical circuit through flexible flat cable elements which connect the base plates end-to-end to each other and to the image pick-up element and to a connector in the rear block assembly for outputting a video signal.

29 Claims, 13 Drawing Sheets

MINIATURIZED VIDEO CAMERA

BACKGROUND OF THE INVENTION

1. Field of the Invention

This invention relates generally to video cameras, and more particularly is directed to miniaturized or small video cameras.

2. Description of the Prior Art

Video cameras are generally classified according to their intended use, for example, broadcasting station use, personal or consumer use and industrial use. Those video cameras intended for personal or consumer use and industrial use are desirably reduced in size for increasing the range of applications thereof.

In existing small video cameras, a front body for supporting a solid-state image pick-up element is fitted on an end of a main casing, and a plurality of base plates on which various electronic elements and components are mounted for constituting a drive circuit of the solid-state image pick-up element are relatively closely packed within the main casing. In the existing small video cameras, the base plates are usually fixed to the main casing by respective screws, or only one of the base plates is thus fixed to the main casing and the other base plates are, in turn, secured to the fixed base plate by connectors or the like. However, the use of screws, as aforesaid, for securing one or more base plates within the main casing undesirably limits the extent to which the sizes of such base plates may be reduced. More specifically, on shown on FIG. 18, each base plate 100 to be secured to the main casing by screws has to be formed with a through hole 101 in each corner portion of the base plate, with each such through hole 101 being spaced at least a predetermined distance d from the edges of the plate 100 which intersect at the respective corner. The distance d must have at least a predetermined value in order to provide sufficient strength, and further to ensure that the head 102 of each screw extending through a hole 101 at a corner of a base plate will not extend beyond the edges of the base plate. Thus, it will be seen that each screw used for securing a base plate 100 to the respective casing makes a respective substantial area of the base plate unusable for the mounting of electronic parts and components. Therefore, at a time when the sizes of electronic parts and components are being substantially reduced so as to make possible a reduction in the overall size of the base plate, the ratio of the area of the base plate required to be reserved for the screws securing the same to the casing relative to the area of the base plate available for the mounting of electronic parts and components becomes undesirably greater.

Furthermore, in the existing video camera construction described above, since at least one of the base plates is fixedly secured to the main casing by screws, vibrations and impacts to which the main casing is subjected are directly transmitted therefrom to the base plates and to the electronic elements thereon which are known to have relatively weak resistance to vibrations and impacts. This problem is made more acute as the volume of soldering employed is decreased with the reduction in size of the electronic parts and components. The reduced amount of solder used for making connections causes the latter to be more susceptible to failure when subjected to vibrations and impacts. The foregoing leads to an undesirable decrease in the reliability of video cameras as the size thereof is substantially reduced.

Further, in existing small video cameras, the front body for supporting the solid-state image pick-up element has a passage of circular cross-section extending therethrough for accommodating an optical path, and such passage also contains a picture frame plate, an optical filter and a cushioning member disposed in the order named in advance of the image pick-up element. The picture frame plate 13' is shown on FIG. 19 to have a generally circular periphery corresponding to the circular cross-section of the passage in the front body and is formed with a rectangular opening or window 13a having an aspect ratio, for example, 3:4, which is the same as the aspect ratio of an image pick-up plane of the solid-state image pick-up element. The purpose of the plate 13' is to frame the picture projected on the image pick-up element by avoiding the impingement of unnecessary light on the image pick-up element, and also to support the optical filter at the front face thereof.

The development of solid-state image pick-up elements has progressed to the point where the size thereof is considerably reduced, with the ratio of the area of the pick-up plane to the total area of the front face of the pick-up element being quite large. In view of the foregoing, it is reasonable to expect that, for reducing the overall size of the video camera, the diameter of the passage in the front body which accommodates the optical path will be reduced to the outer diameter of the solid-state image pick-up element. Of course, in that case, it is necessary to correspondingly reduce the diameter $D_1$ of the circular outer periphery of the picture frame plate 13'. Since the ratio of the area of the pick-up plane to the total area of the circular front face of the image pick-up element is large, the rectangular opening or window 13'a in the frame plate 13' has to be similarly increased in size so that the plate 13 will not eclipse or cast a shadow on the pick-up plane. When that is done, the thickness $d_1$ of the frame plate 13' at the corners of the rectangular opening or window 13'a is undesirably small so that the frame plate 13' is weak at those points giving rise to problems during manufacture and in use.

Referring now to FIG. 20, it will be seen that, in an existing small video camera, the main casing A' has a rectangular cross-section with the aspect ratio of that cross-section being approximately the same as the aspect ratio of the rectangular pick-up plane 16'a of the solid-state image pick-up element 16'. The front block assembly B' includes a front body 7' which defines the cylindrical passage or space 11' in which the picture frame plate 13' and the image pick-up element 16' are accommodated. The front body 7' is shown to have a rectangular front portion 8' corresponding to the cross-section of the main casing A', and to which the latter is secured by screws 12' extending from the opposite sides through holes in the front portion of the main casing A' and into tapped holes in the opposite sides of the front body portion 8'. It will be appreciated that dimension $L'_1$ on FIG. 20 measured from the center of the cylindrical passage 11' to each side of the rectangular body portion 8' and main casing A' is the sum of the radius of the passage 11' and the depth of material of the front body 7' required to accommodate the respective screw 12'. The dimension $L'$ extending diagonally from the center of the passage 11' to each corner of the rectangular cross-section of the main casing A' is obviously larger than the laterally extending measurement $L'_1$. Thus, the interior of a pipe or other space into which the existing video camera shown on FIG. 20 can be inserted, and which is indicated by the dot-dash line X, must have a radius no smaller than the dimension L'. In other words, the pipe or other space X into which the video camera may be inserted has to have a diameter greater than the transverse dimension of the casing A' dictated by the diameter of the solid-state image pick-up element 16' and which would otherwise be sufficient for accommodating the base blocks and associated electronic elements needed to provide the drive circuit for the image pick-up element. Thus, the cross-sectional configuration of the main casing A' of the existing small video camera shown on FIG. 20 limits the extent to which the space required for accommodating such camera may be reduced.

OBJECTS AND SUMMARY OF THE INVENTION

Accordingly, it is an object of the present invention to provide a small video camera in which base plates having electronic components mounted thereon are arranged within a main casing in a manner that substantially reduces the space required therefor, with such base plates being supported relative to the casing so as to be resistant to vibrations and impacts to which the casing may be subjected.

Another object of this invention is to provide a small video camera, as aforesaid, in which the distribution and dissipation of heat are enhanced so that heat generating electronic elements may be safely disposed close to each other on the base plates within the casing.

Still another object of the invention is to provide a small video camera having a solid-state image pick-up element with a pick-up plane which constitutes a large proportion of the frontal area of the pick-up element, and in which the picture frame plate in advance of the image pick-up element has a window large enough to avoid eclipsing or casting a shadow on the pick-up plane, all, without increasing the diameter of the cylindrical passage or optical pathway beyond that required by the solid-state image pick-up element accommodated therein.

Yet another object of this invention is to provide a small video camera, as aforesaid, in which the cross-sectional configuration of the main casing and the manner of its attachment to front and rear block assemblies of the camera are arranged so as to minimize the space required for accommodating the camera.

In accordance with an aspect of this invention, a small video camera comprises a tubular outer casing having openings at its opposite ends and a transverse cross-sectional configuration that is symmetrical about the center thereof; a front block assembly including an image pick-up element secured within the opening at one of the ends of the casing; a rear block assembly including a connector for outputting a video signal and being secured within the opening at the opposite end of the casing; and a base plate assembly including a plurality of elongated base plates arranged in longitudinally overlapped folded relation within the outer casing and having electronic elements mounted thereon, with such base plates being connected end-to-end, for example, by flexible flat cables through which the electronic elements on the several base plates are connected to form a circuit, which is similarly connected, at an end of one of the base plates, to the image pick-up element and, at an end of another of the base plates, to the connector including in the rear block assembly for outputting a video signal.

In accordance with another aspect of this invention, a small video camera, as aforesaid, further includes an inner casing containing the base plates and being axially slidable into the outer casing through one of the openings of the latter, such inner casing having a plurality of lugs struck therefrom and directed inwardly and outwardly, respectively, from the inner casing for pressing resiliently against electronic elements on the base plates and against an inner surface of the outer casing, respectively, so as to cushion the electronic elements against vibrations and impacts to which the outer casing may be subjected.

It is a feature of this invention to form the inner and outer casings of a heat conductive metal so that the escape of heat from the electronic elements mounted on the base plates is enhanced through conduction by way of the lugs of the inner casing pressing resiliently against the electronic elements and the inner surface of the outer casing, and further by convection through circulation of air between the electronic elements and the inner casing and between the inner and outer casings and by eventual radiation from the outer casing.

It is another feature of this invention to provide a small video camera, as aforesaid, with plate-like members of elastomeric heat-conductive material, for example, silicone rubber, interposed between the base plates and being contacted by the electronic elements thereon for equalizing the temperatures along the base plate assembly.

It is still another feature of this invention to provide the outer casing with a substantially octagonal cross-section having four relatively long sides interspersed with four relatively short sides so that the outer casing has equal panels at its top and bottom and its sides with beveled corners therebetween, and to provide the front and rear block assemblies with respective mounting portions having cross-sections corresponding to the internal cross-section of the outer casing so as to fit closely therein, with the end portions of the outer casing being secured to the mounting portions of the front and rear block assemblies by screws extending therethrough at the beveled corners and into the respective mounting portions for minimizing the space required for accommodating the video camera.

In accordance with yet another aspect of the invention, the front block assembly of the video camera further includes a cylindrical portion extending axially away from the respective mounting portion into the outer casing and having four axially extending grooves along such cylindrical portion at angularly spaced positions approximately corresponding to the beveled corners of the outer casing, a picture frame plate, an optical filter and an image pick-up element arranged successively in the cylindrical portion, the picture frame plate having a substantially circular periphery dimensioned to fit into the cylindrical portion and a rectangular window with an aspect ratio corresponding to that of the rectangular pick-up plane of the image pick-up element, and the picture frame plate further having outward projections extending from its periphery at corners of the rectangular window and which extend into the grooves of the cylindrical portion so that the size of the rectangular window can be maximized relative to the pick-up plane of the image pick-up element without unduly affecting the strength of the picture frame plate at the corners of its window.

In accordance with a further feature of this invention, the optical filter is rectangular and fits, at its corners, in the grooves of the cylindrical portion of the front block assembly for rotational alignment with the picture frame plate and the image pick-up element.

The above, and other objects, features and advantages of the invention, will be apparent in the following detailed description of an illustrative embodiment of the invention which is to be read in connection with the accompanying drawings forming a part hereof, and wherein like parts are identified by the same reference numerals in the several views of the drawings.

DETAILED DESCRIPTION OF A PREFERRED EMBODIMENT

Figure 1:
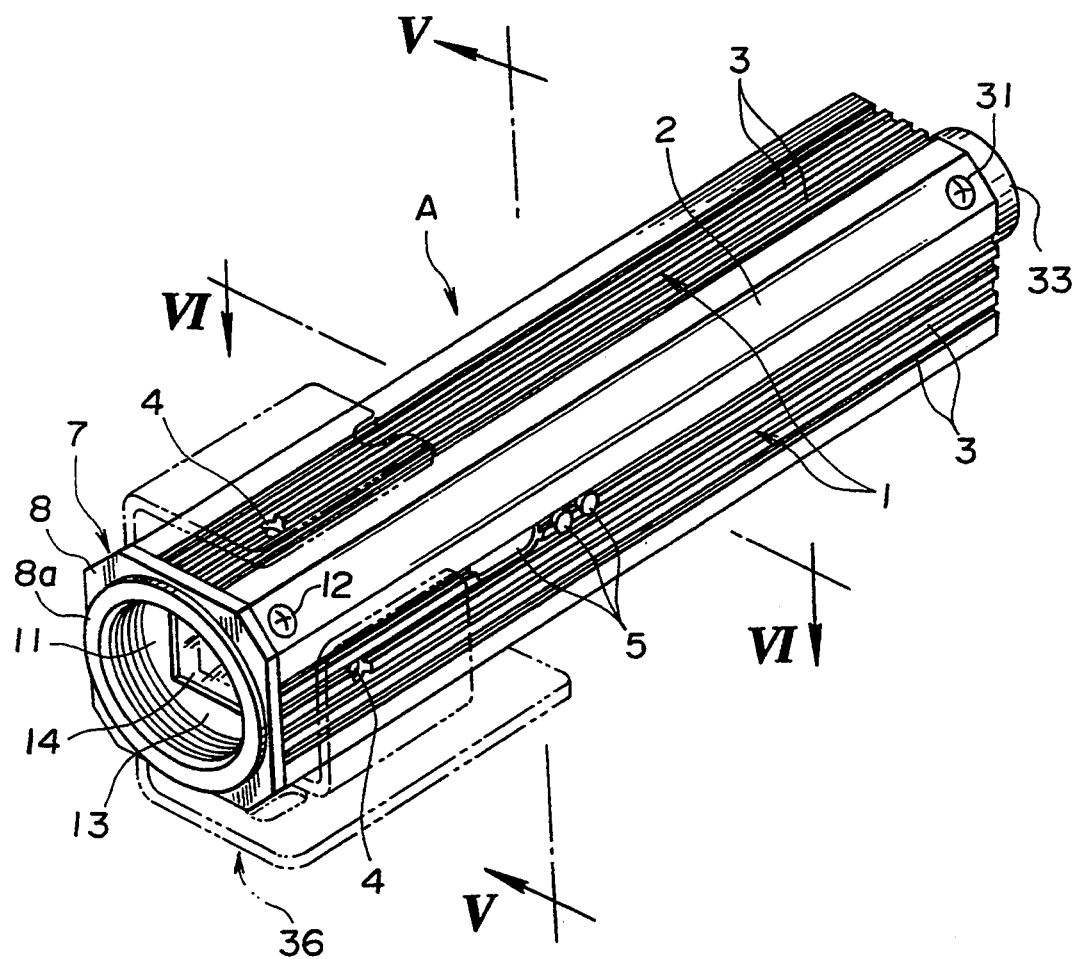
FIG. 1 is a perspective view of a small video camera in accordance with an embodiment of this invention, and with a mounting bracket for the camera being shown in dot-dash lines.
Figure 2:
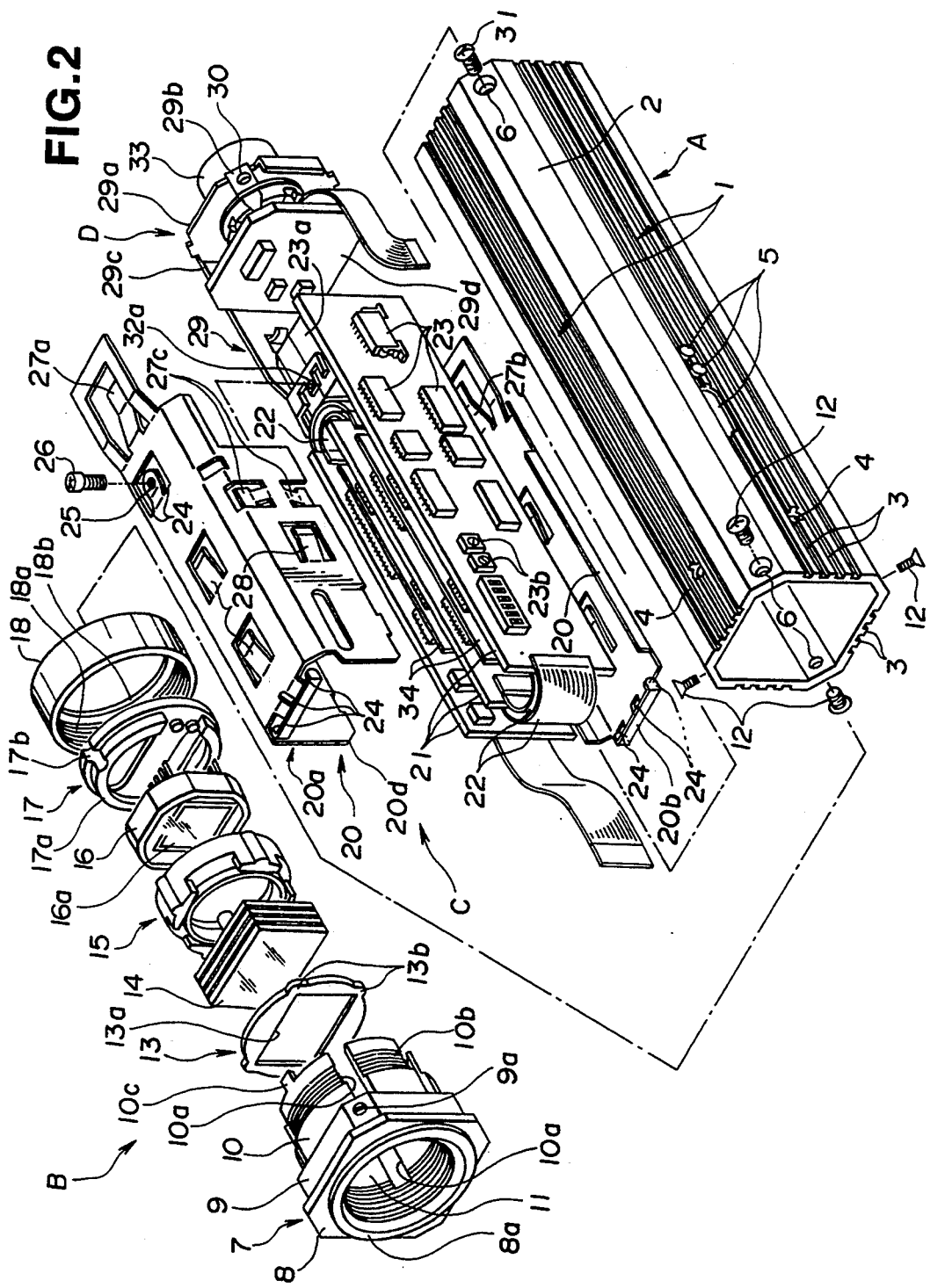
FIG. 2 is an exploded perspective view of the various assemblies that make up the video camera shown on FIG. 1.
Figure 4:
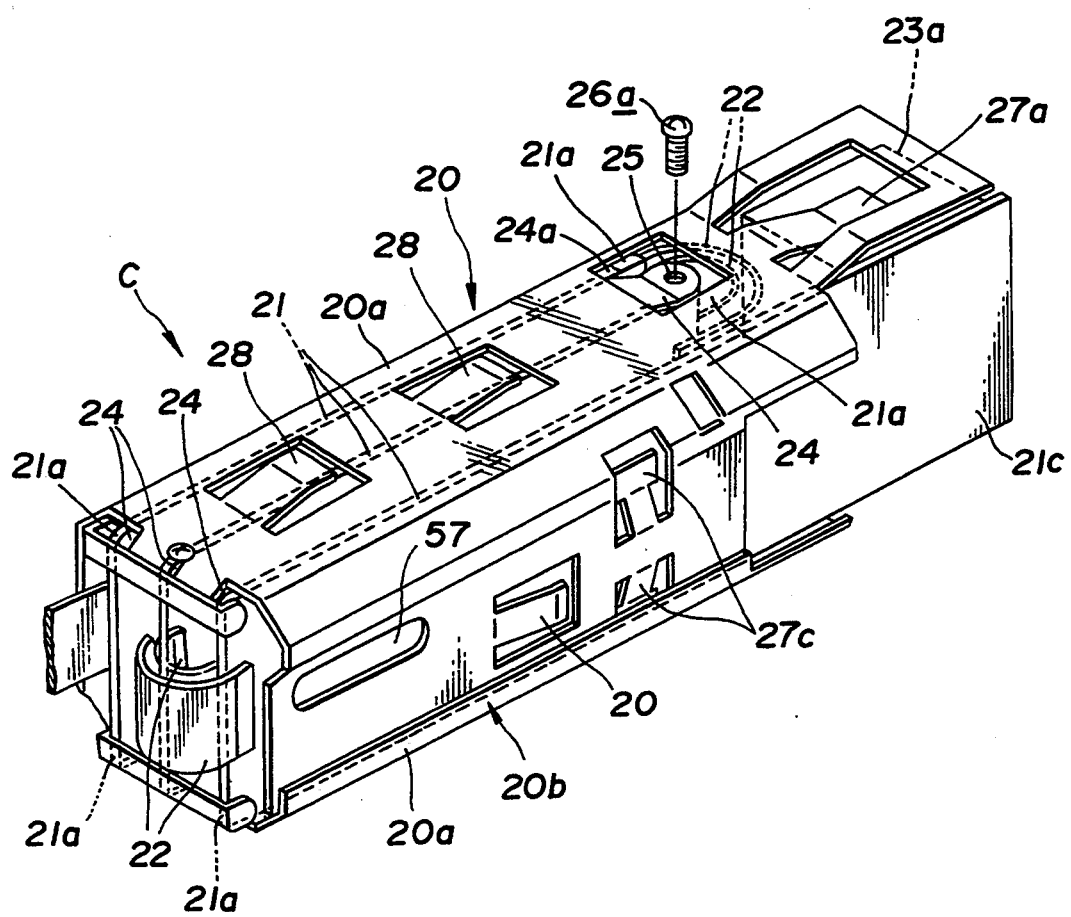
FIG. 4 is a perspective view showing the inner casing and base plate assembly of FIG. 3 assembled together.

Referring to the drawings in detail, and initially to FIGS. 1 and 2 thereof, it will be seen that a video camera in accordance with an embodiment of this invention generally comprises a main or outer casing A, a front block assembly B installed within an open front end portion of the casing A, a base plate assembly C (FIG. 4) disposed within the casing A between the front block assembly B and a rear block assembly D which is installed in an open back end of the casing A.

The outer or main casing A is desirably formed of a metal having good heat conductivity, and is provided with a slender tubular shape having an octagonal or octangular cross-section. The octagonal cross-section of the casing A is shown to have four relatively long sides interspersed with four relatively short sides so that the outer casing has equal relatively wide panels or faces 1 at the top and bottom and at the sides of the casing with beveled corners or inclined faces 2 at 45° to the adjacent panels or faces 1. The four panels 1 are formed with longitudinally extending grooves 3 for increasing the surface area thereof and thereby promoting the radiation of heat from the outer casing A to the surrounding atmosphere. Further, the forward portion of each of the panels 1 is formed with a socket 4 for use in positioning the video camera, as hereinafter described. One of the four faces or panels 1, more specifically, the panel 1 at the side of the casing A facing the viewer on FIGS. 1 add 2, is formed with holes 5 in its upper portion and through which access may be had to adjustable electronic elements included in the base plate assembly C, as hereinafter described. The front end portions of the four beveled corners 2 of casing A have respective holes 6 extending therethrough, and similar through holes 6 are provided in the rear end portions of two diagonally positioned beveled corners 2 (FIG. 2).

Figure 5:
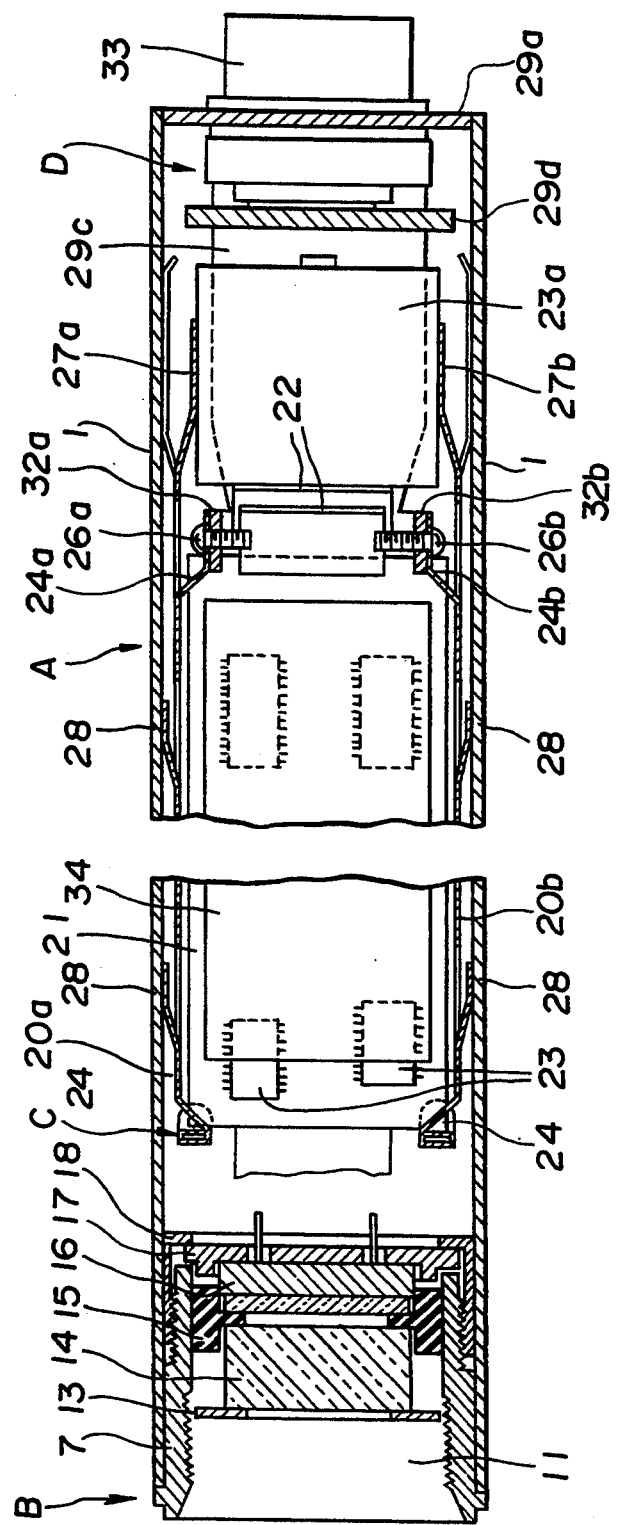
FIG. 5 is an axial sectional view of the video camera of FIG. 1 as viewed in a vertical plane indicated by the arrows V—V on FIG. 1.
Figure 6:
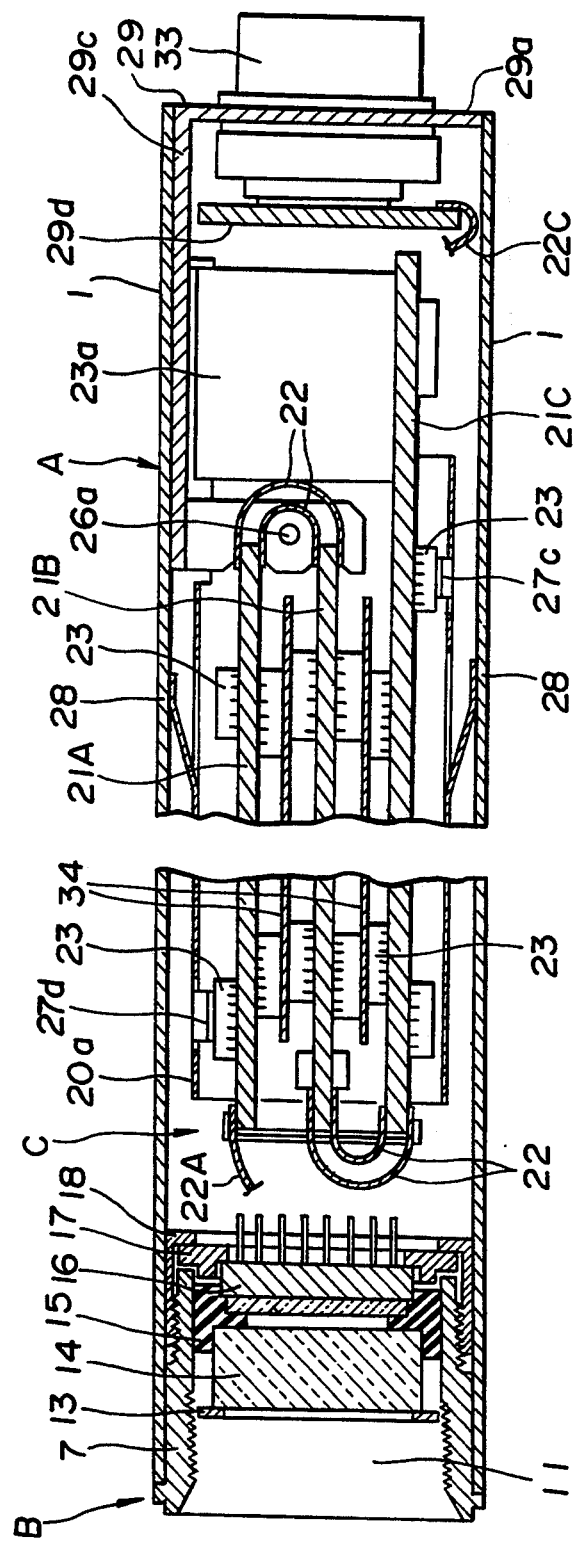
FIG. 6 is an axial sectional view of the video camera of FIG. 1 as viewed in a horizontal plane indicated by the arrows VI—VI on FIG. 1.
Figure 7:
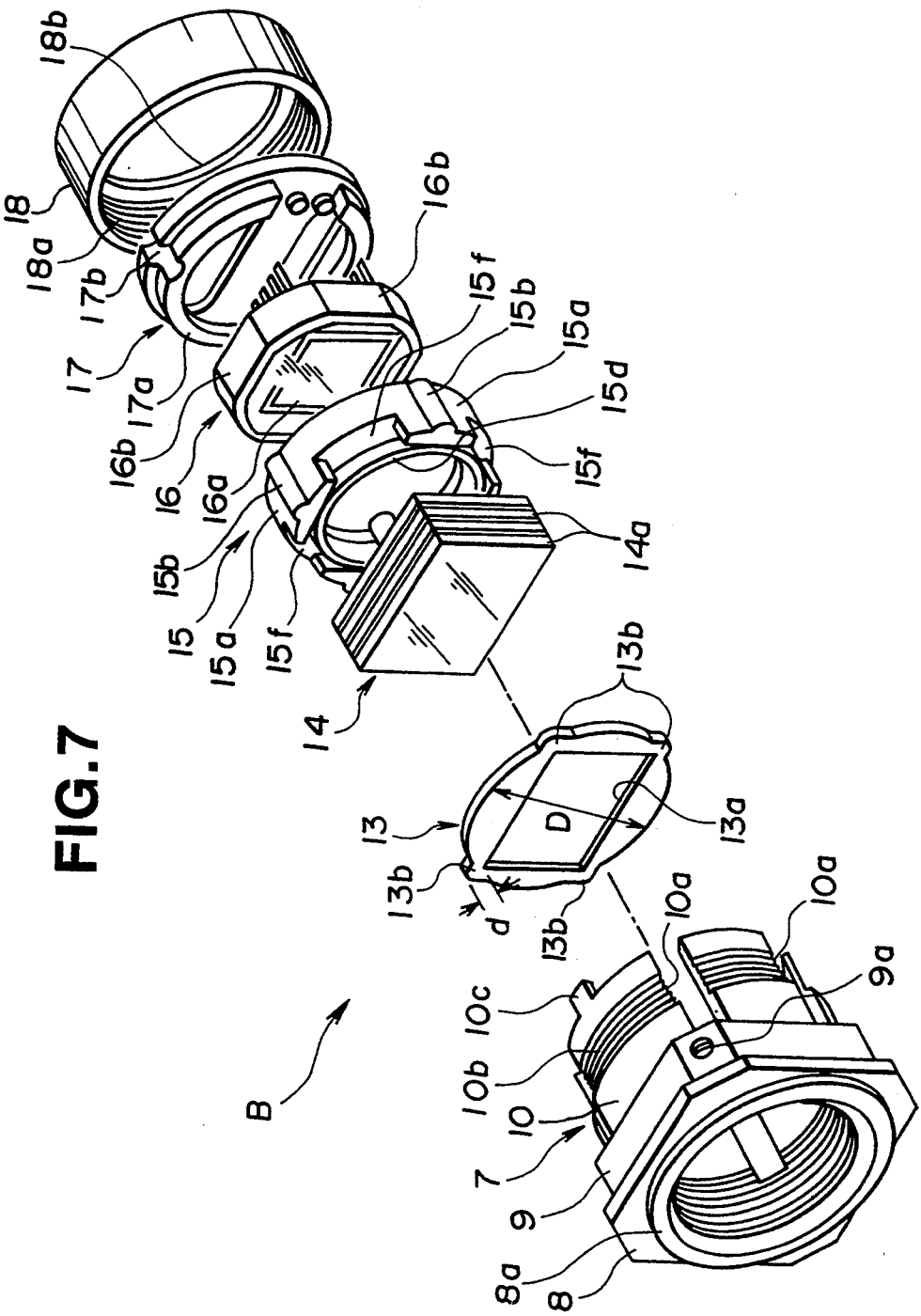
FIG. 7 is an enlarged, exploded perspective view showing details of the elements included in a front block assembly of the video camera shown on FIG. 1.

As shown on FIGS. 2 and 7, the front block assembly B includes a front block body 7 having an octagonal forward portion 8 with its peripheral surface matching the octagonal outer cross-section of the casing A, and which is followed by an integral seating or mounting portion 9 which is also of octagonal configuration, but which corresponds to the internal cross-section of the casing A so as to be insertable into the front end portion of the casing A which then abuts against, and is flush with the forward portion 8. Extending rearwardly from the mounting portion 9, and also integral therewith, is a cylindrical portion 10 which, along with the forward portion 8 and the mounting portion 9 defines a cylindrical passage 11 extending through the front block body 7 and providing a pathway for light entering the camera. The front face of the body portion 8 is formed with a lens mounting reference plane or surface 8a. The beveled corners of the peripheral surface of the mounting portion 9 are formed with threaded holes 9a which are positioned so that, when the mounting portion 9 of the front block body 7 is inserted in the front end portion of the outer casing A, the threaded holes 9a are aligned with the through holes 6 at the front end portions of the beveled corners 2 for receiving screws 12 by which the front block body 7 is secured to the main or outer casing A (FIGS. 1, 5 and 6).

As shown particularly on FIG. 7, the cylindrical portion 10 of the front block body 7 has four axially extending grooves or elongated cutouts 10a extending along the entire length of the cylindrical portion 10 at angularly spaced positions approximately corresponding to the beveled corners of the mounting portion 9. The outer surface of the cylindrical portion 10 has a reduced diameter at its back end section which is externally threaded, as at 10b. A positioning tab 10c projects axially rearward from the free edge of the cylindrical portion 10. The front block body 7 is completed by internal threads 10d formed in the forward portion of the cylindrical passage 11.

The front block assembly B is further shown to include a picture frame plate 13, an optical filter 14, a cushioning member 15, and a solid-state image pick-up element 16 which are intended to be axially inserted in the order named into the passage 11 through the open back-end of the cylindrical portion 10. As will be hereinafter described in greater detail, a backup member 17 is situated within the open back end of the cylindrical portion 10 in back of the image pick-up element 16, and then an adjusting ring member 18 is screwed onto the threads 10b for maintaining the various described elements of the front block assembly B in assembled relation.

As shown particularly on FIG. 7, the picture frame plate 13 has a substantially circular periphery with a diameter D approximately equal to the inner diameter of the cylindrical portion 10, and a rectangular window 13a having an aspect ratio similar to the aspect ratio of a rectangular pick-up plane 16a of the solid-state image pick-up element 16. The picture frame plate 13 is further shown to have outward projections 13b extending from its periphery at locations corresponding to the four corners of the rectangular window 13a, and which extend into the grooves or cutouts 10a of the cylindrical portion 10 when the picture frame plate 13 is inserted in the latter. Thus, the projections 13b serve to rotationally position the picture frame plate 13 within the cylindrical portion 10. More importantly, the projections 13b ensure that there will always be an adequate thickness d of the frame plate material at the corners of the window 13a in the picture frame plate 13 even when the window 13a is enlarged to ensure that the picture frame plate 13 will not eclipse or cast a shadow on the pick-up plane 16a of the image pick-up element 16 when such rectangular pick-up plane 16a has an area constituting a large proportion of the total area of the front face of the pick-up element 16. Since the projections 13b are received in the grooves or cutouts 10a of the cylindrical portion 10, such projections 13b do not require any increase in the cross-sectional size of the mounting portion 9 and the cylindrical portion 10 or of the outer casing A.

The optical filter 14 has a rectangular shape and is formed by laminating a plurality of filter elements 14a which, for example, may constitute a low-pass filter, an infer red cut-off filter, and the like. The optical filter 14 has a diagonal dimension $L_2$ greater than the inner diameter $D_3$ of the cylindrical portion 10 so that the four corner portions of filter 14 also project into the grooves or cutouts 10a of the cylindrical portion 10 and thereby rotational position the optical filter 14 relative to the front block body 7. As shown on FIG. 7, the housing of the solid-state image pick-up element 16 is provided with a generally circular periphery having flat surface portions or facets 16b extending parallel with the top, bottom and sides of the rectangular pick-up plane 16a.

Figure 8:
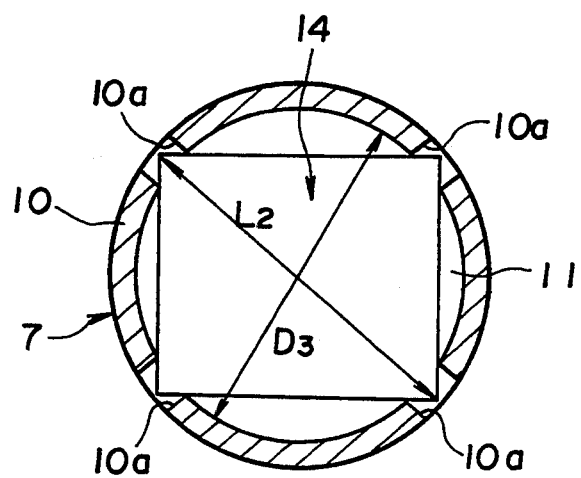
FIG. 8 is a transverse sectional view showing the manner in which an optical filter is received in a cylindrical portion of the front block assembly.
Figure 11:
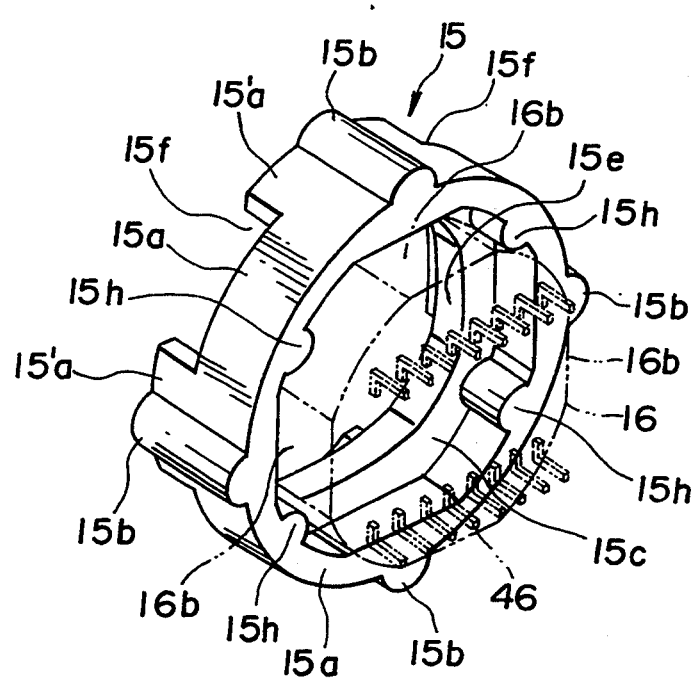
FIG. 11 is an enlarged perspective view of a cushioning member included in the front block assembly of the video camera embodying this invention.
Figure 12:
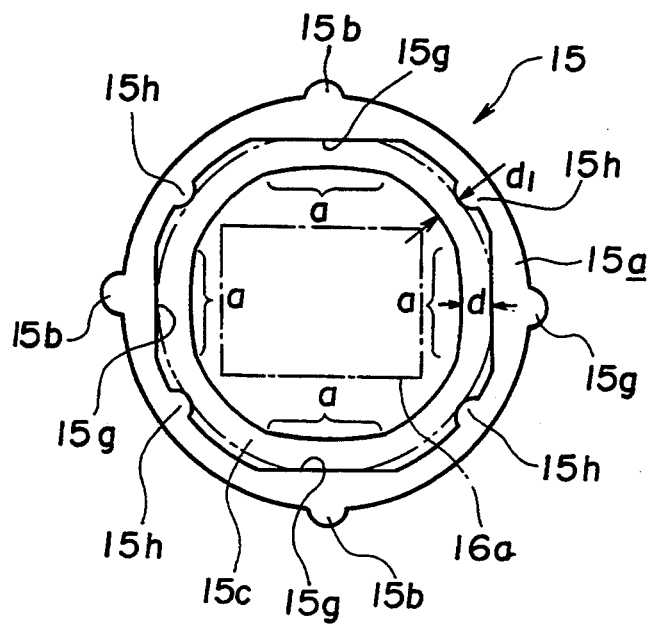
FIGS. 12 and 13 are elevational views showing the cushioning member of FIG. 11 as viewed from the back and front thereof.
Figure 13:
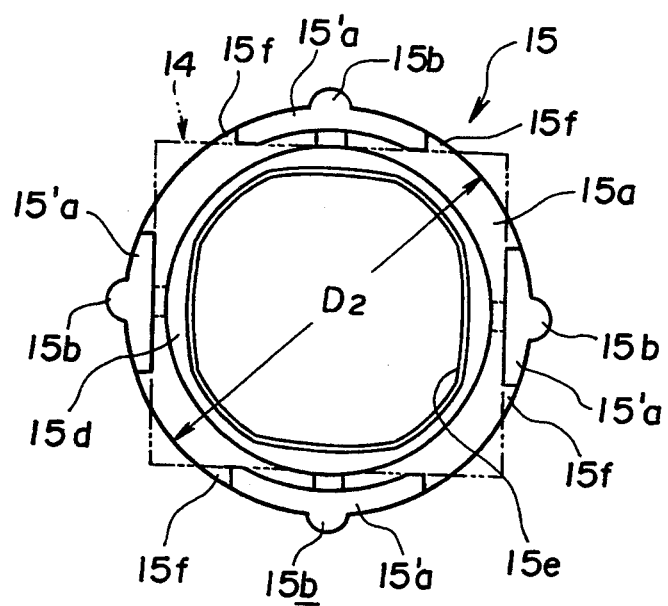

As shown particularly on FIGS. 11, 12 and 13, the cushioning member 15 is generally ring-shaped and includes an annular rim portion 15a having an outer diameter $D_2$ smaller than the inner diameter $D_3$ (FIGS. 8 and 9) of the cylindrical portion 10. Axially directed protuberances 15b extend outwardly from the rim portion 15a at four locations spaced apart by 90° from each other about the rim portion 15a for engaging the inner surface of the cylindrical portion 10. The cushioning member 15 further includes an annular flange 15c directed radially inward from the rim portion 15a approximately midway between front and back edges of the rim portion 15a. A forwardly directed annular ridge 15d extends from the inner periphery 15e of the flange 15c. The rim portion 15a has four cutouts 15f formed therein forwardly of the flange 15c at locations between the protuberances 15b for receiving the corners of the optical filter 14 when the cushioning member 15 is urged forwardly and bears against the back surface of the optical filter 14 by way of the ridge 15d on the flange 15c. The remaining parts 15'a of the rim portion 15a ahead of the flange 15c are engageable with and embrace the top and bottom and opposite side surfaces of the optical filter 14 for cushioning the latter and yieldably positioning the optical filter within the cylindrical portion 10.

As earlier noted, the housing of the image pick-up element 16 has a generally circular periphery with flat surface portions or facets 16b parallel with the top, bottom and sides of the rectangular pick-up plane 16a. Consistently with the foregoing, the rim portion 15a of the cushioning member 15 has an inner surface in back of the flange 15c formed with spaced apart flat surface portions 15g positioned for engaging the flat surface portions or facets 16b of the housing of the image pick-up element 16. Further, axially directed protuberances 15h extend inwardly from the inner surface of the rim 15a in back of the flange 15c at angularly spaced locations between the flat surface portions 15g for engaging the generally circular peripheral portions of the housing of image pick-up element 16 (FIGS. 11 and 12).

Figure 9:
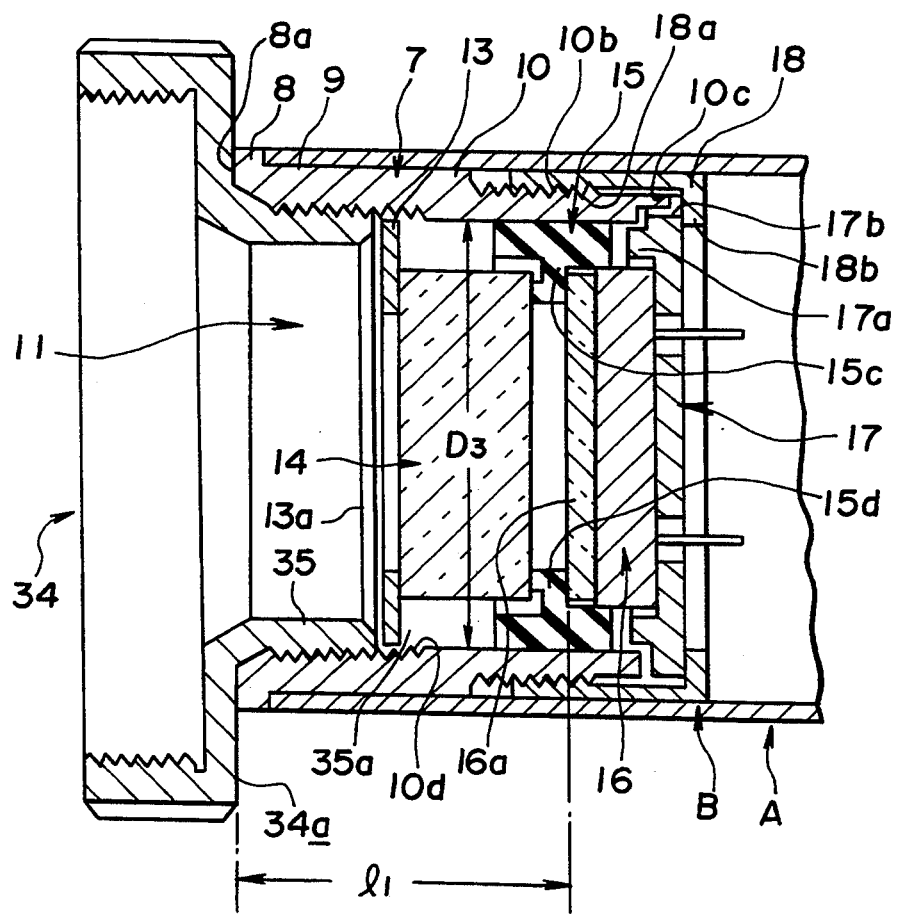
FIG. 9 is an axial sectional view showing the elements of the front block assembly appearing on FIG. 7, and a lens holder or adapter assembled together.

As shown particularly on FIGS. 7 and 9, the back-up member 17 is substantially disk-shaped and has an outer diameter approximately equal to the outer diameter of the cylindrical portion 10 at the back-end of the latter. A circular guide ring portion 17a extends forwardly from the front face of the back-up member 17 and is spaced inwardly from the periphery of the back-up member so as to be insertable into the cylindrical portion 10 at the open back of the latter. The front surface of the back-up member 17 is formed for engagement against the back of the pick-up element 16 with the latter positioned within the circular guide ring portion 17a. The periphery of the back-up member 17, at the top of the latter, is formed with an axially extending groove 17b dimensioned to receive the positioning tab 10c extending from the back edge of the cylindrical portion 10 so as to restrict turning of the back-up member 17 relative to the cylindrical portion 10 of the front block body 7.

The adjusting ring member 18 has internal threads 18a engageable with the threads 10b on the back-end section of the cylindrical portion 10. A radially inwardly directed flange 18b extends from the back edge of the adjusting ring member 18 so as to be engageable forwardly against the back surface of the back-up member 17 adjacent the periphery of the latter.

Figure 3:
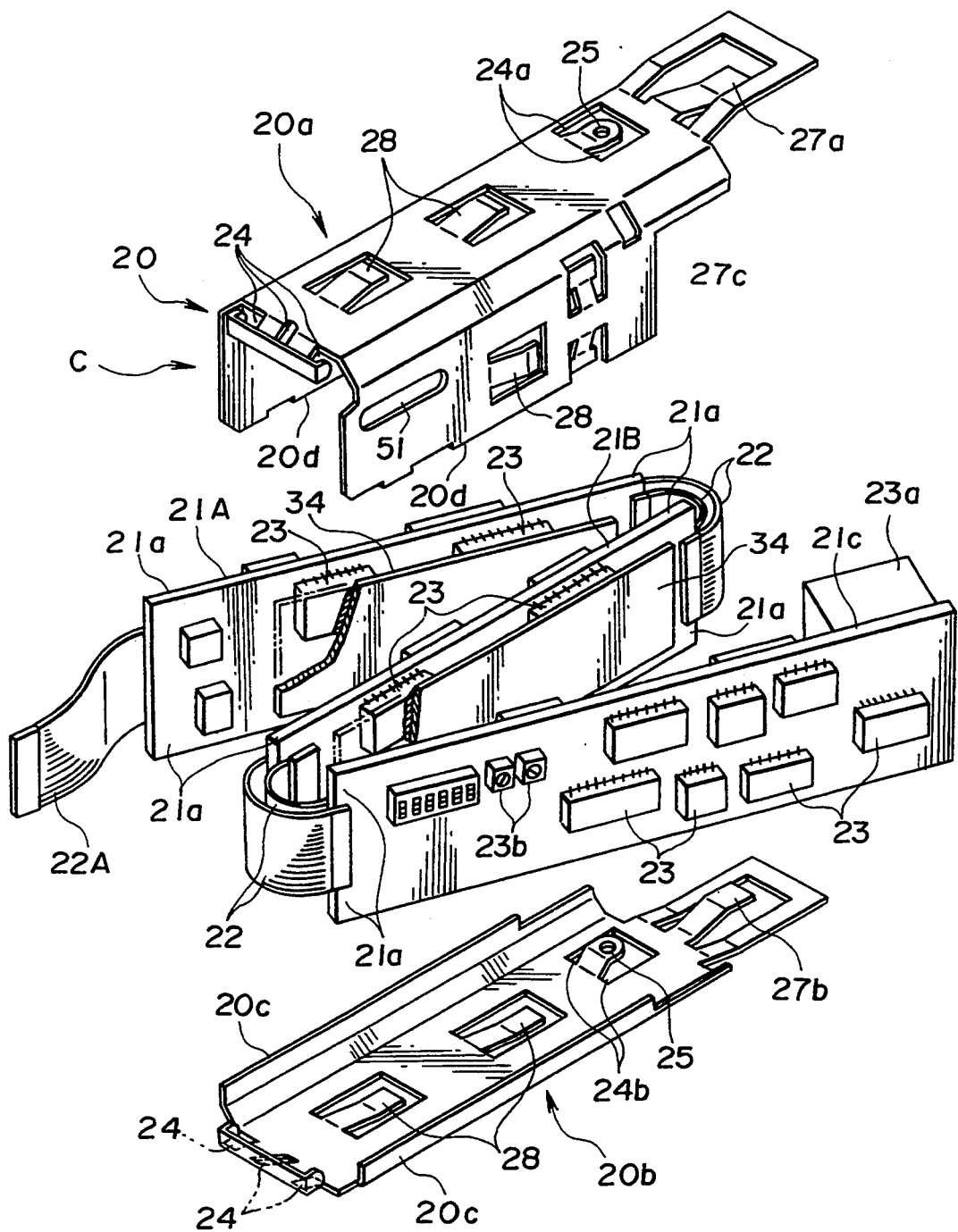
FIG. 3 is an exploded perspective view of a base plate assembly and inner casing included in the video camera of FIGS. 1 and 2.

Referring now to FIGS. 2 and 3, it will be seen that the base plate assembly C generally comprises an inner casing 20 and a plurality of elongated base plates 21 arranged in longitudinally overlapped folded relation and having various electronic elements 23 mounted thereon for positioning within the inner casing 20. The three base plates included in the illustrated embodiment of the invention are separately identified at 21A, 21B and 21C on FIG. 3 and are connected end-to-end, for example, by means of two flexible webs or flexible flat cables 22 which may be of different lengths so as to urge the connected together base plates to assume a zig-zag relation, as shown on FIG. 3. It will be appreciated that the flexible flat cables 22, in addition to connecting the respective base plates 21 also serve to electrically connect the various electronic parts 23 mounted on both faces of each of the base plates so as to provide a suitable electrical circuit for driving the solid-state image pick-up element 16 and for deriving a video signal from its output. A suitable flexible flat cable 22A may also extend from the free end of base plate 21A (FIG. 6) for suitable connection to the image pick-up element 16, while a similar flexible flat cable 22C extends from the free end of the base plate 21C for suitable connection to a connector 33 which, as hereinafter described, is included in the rear block assembly D for outputting the video signal. Preferably, in accordance with this invention, the base plate assembly C further includes plate-like members 34 of elastomeric heat-conductive material, such as, silicone rubber, interposed between the overlapped base plates, that is, between the base plates 21A and 21B and between the base plates 21B and 21C in FIGS. 3 and 6, and being contacted by the electronic elements 23 on such base plates for equalizing temperatures along the base plate assembly C and thereby avoiding the occurrence of hot spots that might damage the electronic elements.

The inner casing 20 is preferably formed of metal having good elasticity and conductivity with a high heat transfer coefficient. In the illustrated embodiment, the inner casing 20 comprises an upper casing member 20a which has a substantially inverted U-shaped cross-section, and a lower plate-like casing member 20b having upwardly directly flanges 20c extending longitudinally along opposite side edges thereof for interfitting engagement with the lower edge portions 20d of the side walls of the upper casing member 20a. The upper and lower casing members 20a and 20b are each formed with a plurality of laterally spaced slits 24 at their forward end portions, and adjacent corners 21a of the base plates 21 are received by such slits 24, as shown particularly on FIG. 4, for transversely positioning respective ends of the base plates relative to the inner casing 20.

As shown particularly on FIG. 6, the flexible flat cable elements 22 connecting the base plates 21A and 21B in end-to-end relation define respective bights when the base plates are in the overlapped folded relation. In order to laterally position the folded base plates 21A and 21B at the back-end portion thereof, the upper wall of the upper casing member 20a has a lug 24a extending from its rear portion with a threaded hole 25 therein (FIG. 4), while the lower casing member 20b similarly has a lug 24b extending from its rear portion (FIG. 5) with a threaded hole therein. The threaded holes of the lugs 24a and 24b are positioned so that, when the corners 21a at the forward ends of the base plates engage in the locating slits 24, screws 26a and 26b engaged in the threaded holes of the lugs 24a and 24b will extend into the bight formed by the flexible flat cables 22 connecting the base plates 21A and 21B for positioning the latter.

It will be appreciated from the above that the slits 24 and the screws 26a and 26b serve to maintain the base plates 21A, 21B and 21C in predetermined spaced apart relation within the inner casing 20.

The back-end portions of the upper and lower casing members 20a and 20b have resilient tongue-like lugs 27a and 27b, respectively, struck inwardly therefrom for pressing resiliently against an electronic element 23a mounted on a back-end portion of the base plate 21C which is substantially longer than the other base plates 21A and 21B, so that, in the zig-zag folded relation of the base plates, the electronic element 23a is disposed in back of the flexible flat cables 22 connecting the back-ends of the base plates 21A and 21B (FIG. 6). It will be appreciated that the lugs 27a and 27b struck from the inner casing 20 so as to engage the upper and lower surfaces of the electronic element 23a are effective to conduct heat away from the latter. Thus, the electronic element 23a may be of a type which generates substantial amounts of heat during its operation.

Additional resilient tongue-like lugs 27c and 27d are also struck inwardly from the opposite side walls of the inner casing 20 (FIG. 6) for pressing resiliently against electronic elements 23 mounted on the outwardly facing surfaces of the base plates 21C and 21A, respectively. Once again, the resilient pressing engagement of the lugs 27c and 27d with respective electronic elements 23 on the base plates 21C and 21A, respectively, serves to conduct heat away from such electronic elements.

Furthermore, the top and sides of the upper casing member 20a and the lower casing member 20b have respective resilient lugs 28 struck outwardly therefrom so that, when the inner casing 20 is disposed within the outer casing A, the outwardly struck lugs 28 press resiliently against the inner surface of the outer casing A at the four panels 1 of the latter. Therefore, the base plate assembly C is resiliently supported within the outer casing A with a clearance between the latter and the inner casing 20 so as to permit the circulation of air within such clearance for enhancing the escape of heat, and further to cushion the electronic components 23 against vibration and impacts to which the outer casing A may be subjected.

As shown on FIGS. 2, 5 and 6, the rear block assembly D includes a block structure 29 having a rear-end plate 29a with an octagonal peripheral configuration corresponding to the inner cross-section of the outer casing A at the rear-end of the latter. A forwardly directed tab 29b extends from each of two diagonally opposed beveled corners of the plate 29a. Each tab 29b has a threaded hole 30 therein, so that, when the plate 29a is inserted in the back-end of the outer casing A, the holes 6 provided in the back-end portions of two diagonally related beveled corners 2 of the outer casing A are aligned with the threaded holes 30 for receiving screws 31 therein by which the rear-end plate 29a is secured in the rear-end of the outer casing A.

A side piece 29c extends forwardly from one side of the rear-end plate 29a and, at its forward end portion, upper and lower support lugs 32a and 32b (FIGS. 2, 5 and 6) extend from the upper and lower edges, respectively, of the side piece 29c across the lugs 24a and 24b, respectively. The support lugs 32a and 32b have respective threaded holes which can be aligned with the holes 25 in the lugs 24a and 24b for also receiving the screws 26a and 26b which thereby serve to connect the rear block assembly D with the base plate assembly C. The rear block assembly D is completed by a board 29d extending laterally from the side plate 29c in front of the end plate 29a and also adapted to have electronic elements mounted thereon, for example, to constitute an output circuit connected with the flexible flat cable 22C and also with the connector 33 mounted on the end plate 29a.

For assembling together the above described elements of the front block assembly B, a lens holder or adapter 34 is installed in the front end portion of the front body 7 (FIG. 9). More specifically, the lens holder 34 is shown to have an externally threaded reduced diameter mounting portion 35 which is screwed into the front end portion of the passage 11 in engagement with the internal threads 10d until a radial face 34a of the lens holder 34 comes into abutting relationship with the lens mounting reference plane or surface 8a. Then, the picture frame plate 13, the optical filter 14, the cushioning member 15, the solid state image pick-up element 16 and the back up member 17 are inserted one after the other, in the order named, through the open back end of the cylindrical portion 10. Finally, the adjusting ring member 18 is screwed onto the threads 10b and its flange 18b, in moving axially toward the lens holder 34, axially compacts the frame plate 13, filter 14, cushioning member 15, image pick-up element 16 and back-up member 17 with the frame plate 13 coming to rest with its front face, adjacent the outer periphery, bearing against the end surface 35a of the mounting portion 35 of the lens holder. Next, a suitable optical distance measuring device is used for measuring the distance $l_1$ from the plane of the lens mounting reference surface 8a to the pick-up plane 16a of the solid-state image pick-up element 16 (FIG. 9). If the measured distance $l_1$ is greater than a predetermined design value, the adjusting ring member 18 is further turned in the direction for effecting its axial movement toward the front of the cylindrical portion 10 with the result that the back-up member 17 and pick-up element 16 are axially displaced in the direction to compress the annular ridge 15d on the flange 15c. Thus, the distance $l_1$ is reduced. On the other hand, if the distance $l_1$ is then found to be less than the desired value, turning of the adjusting ring member 18 in the direction effecting rearward axial movement thereof relative to the cylindrical portion 10 permits the annular ridge 15d to expand and thereby move the solid-state image pick-up element 16 rearwardly, that is, in the direction for increasing the value of the distance $l_1$. When the predetermined or desired value of the distance $l_1$ has been obtained, a suitable adhesive is applied for securing the adjusting ring member 18 against turning relative to the cylindrical portion 10.

In assembling the base plate assembly C, the three base plates 21A, 21B and 21C are relatively bent in a zig-zag manner and then covered by the upper casing member 20a and the lower casing member 21b while engaging the corners 21a of the base plates in the slits 24 of the upper and lower casing members 20a and 20b. Then, the threaded holes in the support lugs 32a and 32b provided on the rear block structure 29 are aligned with the through holes 25 provided in the lugs 24a and 24b for receiving the screws 26a and 26b, respectively, whereby the base plate assembly C and the rear block assembly D are joined together.

Final assembly of the video camera is effected by axially inserting the base plate assembly C joined with the rear block assembly D into the outer casing A through the opening at the rear thereof, and then driving the screws 31 into the respective threaded holes 30 when the latter are aligned with the through holes 6 in the rear-end portion of the outer casing A. During such axial insertion of the base plate assembly C into the outer casing A, the resilient lugs 28 which extend in the direction toward the rear of the inner casing 20 are successively subjected to inward elastic deformation so that the base plate assembly C is resiliently held in a centered position within the casing A by the resilient lugs 28. Ultimately, the front block assembly B is axially inserted into the outer casing A through the open front thereof and the screws 12 are driven into the threaded holes 9a in the mounting portion 9 of the front block 7 when such threaded holes 9a are aligned with the through holes 6 in the forward end portions of the beveled corners 2 of the outer casing A.

As earlier noted, in the assembled video camera embodying the present invention, when vibrations or impacts are applied to the outer casing A, these vibrations and impacts are cushioned by the resilient lugs 28 extending from the inner casing 20, and are not transmitted to the base plates 21A–21C within the inner casing 20. Further, since the base plates 21A–21B are positioned by engagement of the corners thereof in slits 24 of the inner casing 20, vibrations or impacts apply to the outer casing are not effective to displace the base plates relative to each other.

Since vibrations and impacts applied externally to the video camera are isolated from the electronic parts and elements mounted on the base plates 21A–21C, such electronic parts can be reduced in size without the fear that such size reduction, and consequent decrease in strength, will increase the likelihood of failure due to the applied vibrations and impacts. Moreover, positioning the base plates 21A–21C within the inner casing 20 by engaging the corners 21A of the base plates in the slits 24 of the upper and lower casing members 20a and 20b makes it unnecessary to provide additional screws or other attaching elements for that purpose so that the ratio of the area of each of the base plates available for the mounting of electronic elements thereon relative to the total area of the base plates is increased. By reason of the foregoing, the base plates can be reduced in size with a consequent reduction in the overall size of the video camera.

Figure 10:
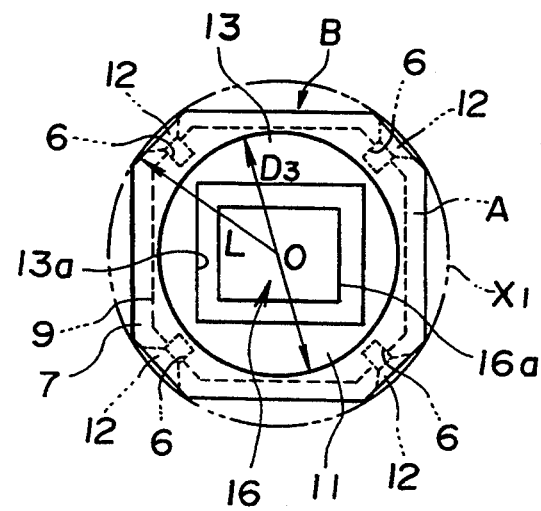
FIG. 10 is a front end elevational view of the video camera appearing on FIG. 1.
Figure 20:
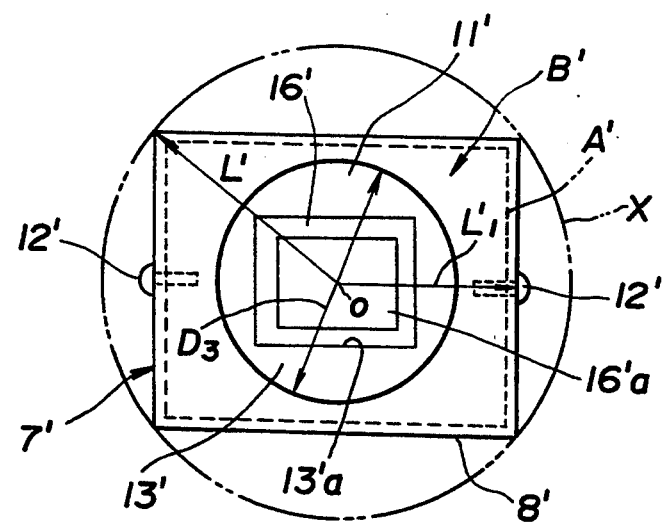
FIG. 20 is a front end elevational view of a small video camera according to the prior art.

Given a particular internal diameter $D_3$ (FIGS. 9 and 10) of the passage 11 needed in the front block 7 for the optical path of the light which is to impinge on the solid-state image pick-up element 16, and which is essentially determined by the diameter of such image pick-up element, it will be seen from a comparison of FIG. 10 with FIG. 20 that the octagonal cross-sectional shape of the outer casing A and of the mounting portion 9 of the front block 7 in a video camera embodying the present invention permits a very substantial reduction of the size of the camera, and hence of the space required for accommodating the same. More specifically, as shown on FIG. 10, by providing the outer casing A and the mounting portion 9 of the front block 7 with the described octagonal cross-sections, the beveled corners of the outer casing A and mounting portion 9 are available for receiving the screws 12 by which the casing A is secured to the front block 7. At such beveled corners, the thickness of the mounting portion 9 outside of the passage 11 is substantially greater than the thickness of the mounting portion 9 at the diametrically opposed sides of the passage 11. Thus, the diagonal distance L measured radially outward from the center O to the outer surface of each beveled corner in FIG. 10, and which defines the radius of the space $X_1$ needed to accommodate the video camera embodying the invention, may be approximately equal to the lateral dimension $L'_1$ measured from the center O to the outer side surface of the camera according to the prior art shown on FIG. 20. It will be appreciated that the diagonal distance L on the video camera embodying the invention shown on FIG. 10 is substantially smaller than the diagonal distance L' shown on FIG. 20, and which in that case defines the radius of the space X needed to accommodate the video camera according to the prior art. Therefore, the cross-sectional shape given to the outer casing A of the video camera according to this invention so that such outer casing can be secured to the front block 7 at the diagonally disposed beveled corners serves to make possible further reductions in the size of the video camera.

Moreover, as earlier described, by providing the protrusions 13b extending outwardly from the periphery of the frame plate 13 at the corners of the rectangular window 13a therein, and which are received in the grooves 10a of the cylindrical portion 10 of the front body 7, such window 13a can be increased in size for avoiding the casting of a shadow on the pick-up plane 16a of the solid-state image pick-up element 16 without requiring an increase in the diameter $D_3$ of the passage 11 extending through the front block 7 and also without undesirably weakening the frame plate 13 at the corners of the enlarged window 13a.

Figure 16:
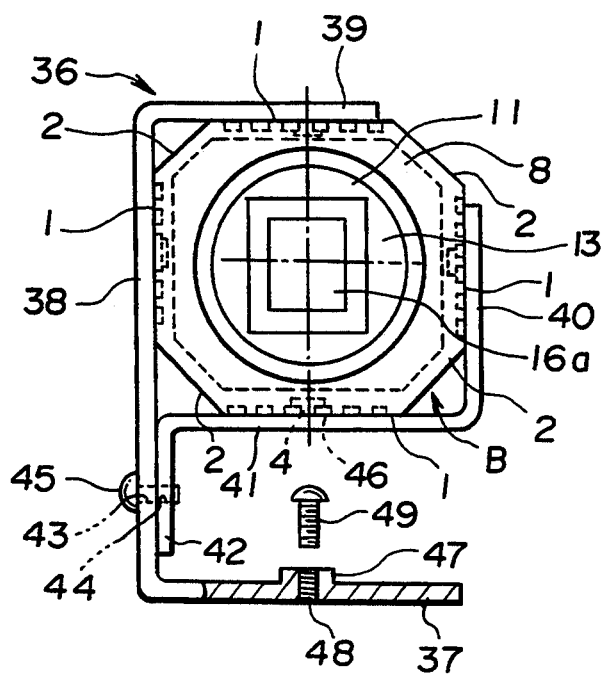
FIGS. 16 and 17 are front elevational views of the video camera of FIG. 1 shown installed in different respective orientations on the mounting bracket of FIG. 14.
Figure 17:
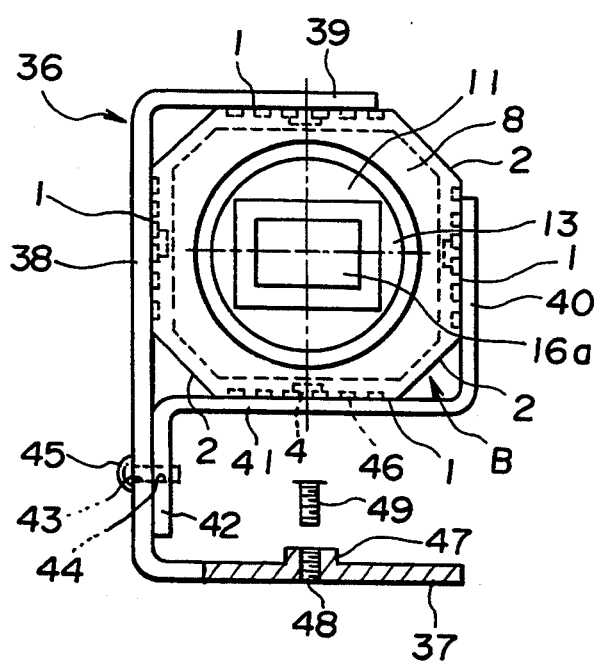
Figure 18:
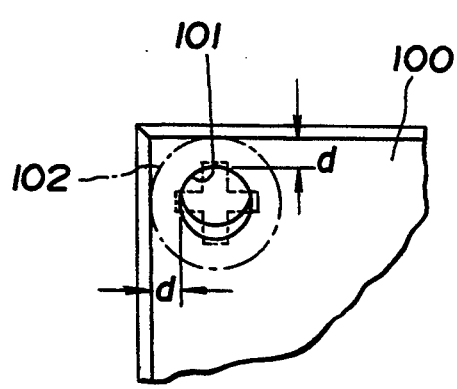
FIG. 18 is an enlarged fragmentary elevational view illustrating how a base plate is secured in a video camera according to the prior art.
Figure 19:
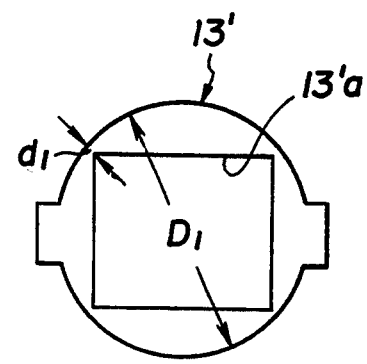
FIG. 19 is a front elevational view of a picture frame plate according to the prior art.

It is also to be noted that the octagonal cross-section of the outer casing A is symmetrical about the center O (FIG. 10) so that a mounting bracket 36 may be provided for supporting the video camera in one of two different orientations relative to the mounting bracket, as shown on FIGS. 16 and 17, respectively. More specifically, the illustrated mounting bracket 36 includes a base portion 37 having an upstanding part 38 extending from one side of the base portion 37 and terminating, at the top, in a laterally directed extension 39 at right angles to the upstanding part 38 and extending from the latter in the same direction as the base portion 37. The mounting bracket 36 further includes a clamping member having right angularly related arms 40 and 41 and a flange 42 extending from the end of the arm 41 remote from the arm 40 in a direction opposed to the direction of the arm 40. The lower portion of the upstanding part 38 and the flange 42 have aligned holes 43 and 44, respectively, with the holes 44 being threaded so that screws 45 can be driven into the aligned holes 43 and 44 for releasably securing the flange 42 to the upstanding part 38, as shown on FIGS. 16 and 17.

It will be seen that, when the parts of the mounting bracket 36 are secured together, as described above, the arms 40 and 41 of the clamping member, the upper portion of the upstanding part 38 and the laterally directed extension 39 thereof substantially enclose a square space dimensioned to accommodate the outer casing A with the four relatively wide faces or panels 1 thereof being engaged by the arms 40 and 41, the upstanding part 38 and the lateral extension 39, as shown on each of FIGS. 16 and 17. As shown particularly on FIG. 14, a locating pin 46 extends upwardly from the arm 41 of the mounting bracket 36 and is receivable in the socket 4 formed in the face or panel 1 of the outer casing A which then engages the arm 41 of the mounting bracket for preventing axial sliding movements of the camera relative to the mounting bracket.

By reason of the symmetrical arrangement of the cross-section of the outer casing A about the center O and the square configuration of the space contained within the mounting bracket 36, the video camera embodying this invention may be arranged in different orientations within the mounting bracket, for example, with the relatively long axis of its rectangular pick-up plane 16a extending vertically, as in FIG. 16, or horizontally, as in FIG. 17. In either case, the socket 4 in the face or panel 1 of the outer casing A then facing downwardly on the arm 41 is suitably engaged by the locating pin 46 on such arm 41.

For securing the mounting bracket 36 at any location where use of the video camera may be desired, the base portion 37 is formed with a centrally located boss 47 having a tapped hole 48 extending therethrough for receiving a suitable anchoring screw 49. A shown on FIG. 14, the base portion 37 may further have elongated holes 50 at opposite sides of the boss 47 for receiving other fastening members (not shown).

Figure 15:
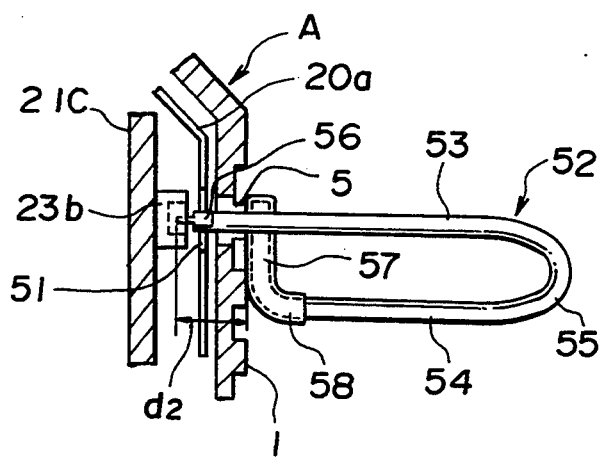
FIG. 15 is a detail view, partly in section, illustrating how the adjustment tool is used in association with the video camera of FIG. 1.

As shown particularly on FIG. 3, among the electronic elements or parts mounted on the base plate 21C may be electronic elements 23b each having a rotatable adjustment member with a slotted head, and which are disposed so that, in the assembled video camera, access to such rotatable adjustment members may be had through the access openings 5 in the outer casing A and through an opening 51 (FIGS. 3 and 4) in a side of the inner casing C which is aligned with the access openings 5. It is important when effecting adjustment of one of the elements 23b to ensure that a screwdriver or other similar tool employed therefor does not exert an excessive axial pressure on the element 23b which, by reason of its small size, could be damaged by such axial pressure. Therefore, in accordance with the present invention, a special purpose tool 52 (FIG. 15) is provided. As shown, the special purpose tool 52 is formed of a continuous length of rigid wire which is suitably bent to include two parallel spaced apart straight portions 53 and 54 connected, at one end, by a bight portion 55 to provide a handle, with a blade-like end portion 56 extending longitudinally from the end of the straight portion 53 remote from the bight portion 55, and with a cross piece 57 extending laterally from the end of the straight portion 54 remote from the bight portion 55 and intersecting or extending across the other straight portion 53. The distance $d_2$ that the blade-like end portion 56 extends beyond the cross piece 57 determines the distance that the blade-like end portion can extend inwardly through the holes 5 and 51 beyond the outer surface of the casing A. Thus, the axial pressure that can be exerted by the tool 52 on the adjustable element 23b is limited by engagement of the cross piece 57 with the outer surface of the casing A. In order to avoid scarring of the outer surface of the casing A when the tool 52 is rotated, a plastic sleeve 58 may be provided on the cross piece 57.

Figure 14:
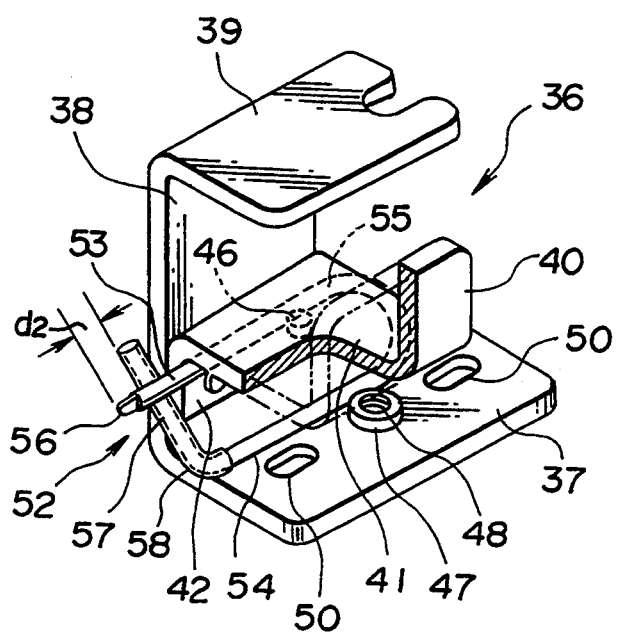
FIG. 14 is a perspective view of a mounting bracket for the video camera of FIG. 1, and which is shown partly broken and in section for exposing an adjustment tool stowed on the mounting bracket.

In order to ensure that the special purpose tool 52 will always be available for effecting adjustments of the video camera, the distance between the spaced apart straight portions 53 and 54 of the tool 52 is selected to resilient retain the tool with one of its straight portions 53 nested in the angle between the flange 42 and the arm 41 while the other straight portion 54 is resilient urged against the boss 47 on the base portion 37, as shown on FIG. 14. The tool 52 can be readily released from its stowed position shown on FIG. 14 simply by manually urging toward each other the ends of the straight portions 53 and 54 remote from the bight portion 55.

Although a particular preferred embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A video camera comprising:
a tubular outer casing having openings at opposite ends and a transverse cross-sectional configuration that is symmetrical about the center thereof;
front and rear block assemblies respectively secured within said openings at the opposite ends of said tubular outer casing;
an image pick-up element included in said front block assembly;
connector means included in said rear block assembly for outputting a video signal; and
a base plate assembly disposed within said tubular outer casing between said front and rear block assemblies and including a plurality of elongated base plates arranged in longitudinally overlapped folded relation and having electronic elements mounted thereon, means connecting said elongated base plates end-to-end and through which said electronic elements are connected to form a circuit, means connecting said circuit to said image pick-up element at an end of one of said elongated base plates and to said connector means at an end of another of said elongated base plates, and plate-like members of elastomeric heat-conductive material interposed between said elongated base plates and being contacted by said electronic elements mounted on at least one adjacent elongated base plate for equalizing temperatures along said base plate assembly.

2. A video camera as in claim 1; in which there are at least three of said elongated base plates arranged in zig-zag relation.

3. A video camera as in claim 2; in which at least one of said elongated base plates has a length greater than another of said elongated base plates.

4. A video camera as in claim 1; in which said means connecting said elongated base-plates end-to-end includes flexible flat cable elements.

5. A video camera as in claim 1; in Which said tubular outer casing has a basically octangular cross-section that is symmetrical about the center thereof and has four first sides interspersed with four second sides in which each of said first sides is longer than each of said second sides so that said tubular outer casing has equal panels at top, bottom and sides thereof with corner bevels therebetween; and in which said front and rear block assemblies have respective mounting portions with cross-sections corresponding to the internal cross-section of said tubular outer casing so as to fit closely, and be secured in respective end portions of said tubular outer casing.

6. A video camera comprising:
a tubular outer casing having openings at opposite ends and a transverse cross-sectional configuration that is symmetrical about the center thereof, said tubular outer casing being of a heat conductive material;
front and rear block assemblies respectively secured within said openings at the opposite ends of said tubular outer casing;
an image pick-up element included in said front block assembly;
connector means included in said rear block assembly for outputting a video signal; and
a base plate assembly disposed within said tubular outer casing between said front and rear block assemblies and including a plurality of elongated base plates arranged in longitudinally overlapped folded relation and having electronic elements mounted thereon, means connecting said elongated base plates end-to-end and through which said electronic elements are connected to form a circuit, means connecting said circuit to said image pick-up element at an end of one of said elongated base plates and to said connector means at an end of another of said elongated base plates, and an inner casing containing said base plates and being axially slidable into said tubular outer casing through one of said openings of the latter, said inner casing being of a heat conductive metal and having a plurality of lugs struck therefrom and directed inwardly and outwardly, respectively, from said inner casing, said inwardly directed and outwardly directed lugs pressing resiliently against respective ones of said electronic elements on said base plates and against an inner surface of said outer casing, respectively, for permitting air circulation between said electronic elements and said inner casing and between said inner and outer casings and thereby enhancing the escape of heat from said electronic elements to the surrounding atmosphere.

7. A video camera as in claim 6; in which said inner casing has a plurality of slits spread laterally apart adjacent at least one end of said inner casing, and in which corners of said elongated base plates are received in said slits for transversely positioning respective ends of said elongated base plates relative to said inner casing.

8. A video camera as in claim 6; in which said base plate assembly further includes plate-like members of elastomeric heat-conductive material interposed between said elongated base plates in overlapped relation and being contacted by said electronic elements thereon for equalizing temperatures along said base plate assembly.

9. A video camera as in claim 8; in which said plate-like members are of a silicone rubber.

10. A video camera as in claim 8; in which said elastomeric heat-conductive material is a silicone rubber.

11. A video camera comprising:
a tubular outer casing having openings at opposite ends and a transverse cross-sectional configuration that is symmetrical about the center thereof;
front and rear block assemblies respectively secured within said openings at the opposite ends of said tubular outer casing;
an image pick-up element included in said front block assembly;
connector means included in said rear block assembly for outputting a video signal; and
a base plate assembly disposed within said tubular outer casing between said front and rear block assemblies and including a plurality of elongated base plates arranged in longitudinally overlapped folded relation and having electronic elements mounted thereon, means connecting said elongated base plates end-to-end and through which said electronic elements are connected to form a circuit, means connecting said circuit to said image pick-up element at an end of one of said elongated base plates and to said connector means at an end of another of said elongated base plates, and an inner casing containing said elongated base plates and being axially slidable into said tubular outer casing through one of said openings of the latter, said inner casing having a plurality of lugs struck therefrom and directed inwardly and outwardly, respectively, from said inner casing for pressing resiliently against electronic elements on said elongated base plates and against an inner surface of said tubular outer casing, respectively, so as to cushion said electronic elements against impacts to which said tubular outer casing is subjected.

12. A video camera as in claim 11; in which said inner casing has a plurality of slits spaced laterally apart at the end of said inner casing adjacent said front block assembly and in which adjacent corners of said elongated base plates are received by said slits for transversely positioning respective ends of said elongated base plates relative to said inner casing; said means connecting said elongated base plates end-to-end include flexible flat cable elements which define respective bights when said elongated base plates are in said overlapped folded relation, and said inner casing, adjacent the end thereof near to said rear block assembly, has opposed threaded holes to receive screws which, at inner end portions, engage in said bights of the flexible flat cable elements connecting said elongated base plates near to said rear block assembly.

13. A video camera as in claim 11; in which said inner casing includes a bottom portion with upwardly directed flanges extending longitudinally along opposite side edges thereof, and an upper portion of inverted U-shaped cross-section interfitting with said flanges along the side edges of said bottom portion.

14. A video camera as in claim 11; in which each of said inner and outer casings has basically an octangular cross-section having four relatively long sides interspersed with four relatively short sides so that said outer casing has equal panels at top, bottom and sides thereof with corner bevels therebetween.

15. A video camera as in claim 14; in which said front and rear block assemblies have respective mounting portions with cross-sections corresponding to the internal cross-section of said outer casing so as to fit closely in the latter at respective end portions thereof, and said end portions of said outer casing have holes in said corner bevels registering with respective threaded holes in said mounting portions and receiving respective screws by which said front and rear block assemblies are secured to said outer casing.

16. A video camera comprising:
a tubular outer casing having openings at opposite ends and a basically octangular cross-section that is symmetrical about the center thereof and which has four relatively long sides interspersed with four relatively short sides so that said tubular outer casing has equal panels at top, bottom and sides thereof with corner bevels therebetween;
front and rear block assemblies respectively secured within said openings at the opposite ends of said tubular outer casing, said front and rear block assemblies have respective mounting portions with cross-sections corresponding to the internal cross-section of said tubular outer casing so as to fit closely, and be secured in respective end portions of said tubular outer casing, said front block assembly further includes a cylindrical portion extending axially from the respective mounting portion into said tubular outer casing and having four axially extending grooves extending along said cylindrical portion at angularly spaced positions approximately corresponding to said corner bevels of said tubular outer casing, a picture frame plate, an optical filter and an image pick-up element arranged successively in said cylindrical portion, said image pick-up element having a rectangular pick-up plane with a predetermined aspect ratio, said picture frame plate having a substantially circular periphery dimensioned to fit into said cylindrical portion and a rectangular window with said predetermined aspect ratio, and said picture frame plate further having outward projections extending from said periphery at corners of said rectangular window and which extend into said grooves of said cylindrical portion so that the size of said rectangular window can be maximized relative to said pick-up plane without unduly affecting the strength of said picture frame plate at said corners of the window;
an image pick-up element included in said front block assembly;
connector means included in said rear block assembly for outputting a video signal; and
a base plate assembly disposed within said tubular outer casing between said front and rear block assemblies and including a plurality of elongated base plates arranged in longitudinally overlapped folded relation and having electronic elements mounted thereon, means connecting said elongated base plates end-to-end and through which said electronic elements are connected to form a circuit, and means connecting said circuit to said image pick-up element at an end of one of said elongated base plates and to said connector means at an end of another of said elongated base plates.

17. A video camera as in claim 16; in which said optical filter is rectangular and fits, at corners of said optical filter, in said grooves of the cylindrical portion for rotational alignment with said picture frame plate and said image pick-up element.

18. A video camera as in claim 17; in which said front block assembly further includes a cushioning member of an elastic material interposed between said optical filter and said image pick-up element.

19. A video camera as in claim 18; in which said cylindrical portion has internal threads and said mounting portion of the front block assembly has a lens locating surface; and in which said front block assembly includes a lens holder engaging said internal threads and seating against said lens locating surface, external threads on said cylindrical portion, a backup member in back of said image pick-up element, and an adjusting ring element screwed on said external threads and engaging said back-up member for adjusting said image pick-up element axially against the yieldable resistance of said cushioning member and thereby varying the distance between said lens locating surface and said pick-up plane.

20. A video camera as in claim 19; in which said cylindrical portion has an axial projection extending rearwardly therefrom, and said back-up member has an axial groove in the outer periphery thereof slidably receiving said axial projection for determining a rotational position of said back-up member and said image pick-up element in respect to said cylindrical portion.

21. A video camera as in claim 19; in which said cushioning member includes an annular rim portion having an outer diameter smaller than the inner diameter of said cylindrical portion and axially directed protuberances extending outwardly from said rim portion at spaced apart locations about the latter for engaging the inner surface of said cylindrical portion.

22. A video camera as in claim 21; in which said cushioning member further includes an annular mid-flange directed radially inward from said rim portion between front and back edges of the latter, a forwardly directed ridge extending from the inner periphery of said annular mid-flange for engagement against said optical filter, said rim portion having cutouts forwardly of said mid-flange between said protuberances for receiving corners of said optical filter.

23. A video camera as in claim 22; in which said image pick-up element includes a housing with a generally circular periphery having flat surface portions parallel with the top, bottom and sides of said rectangular pick-up plane; and in which said rim portion of the cushioning member has an inner surface in back of said mid-flange with spaced apart flat surface portions engaging said flat surface portions of the housing of said image pick-up element and with axially directed protuberances extending inwardly from said inner surface for engaging said periphery of the housing between said flat surface portions.

24. A video camera comprising:
a tubular outer casing having openings at opposite ends and a basically octangular cross-section that is symmetrical about the center thereof and which is comprised of four relatively long sides interspersed with four relatively short sides so that said tubular outer casing has four equal panels connected at bevelled corners, and each of said panels has a similarly positioned socket therein;
front and rear block assemblies respectively secured within said openings at the opposite ends of said tubular outer casing;
an image pick-up element included in said front block assembly;
connector means included in said rear block assembly for outputting a video signal;
a base plate assembly disposed within said tubular outer casing between said front and rear block assemblies and including a plurality of elongated base plates arranged in longitudinally overlapped folded relation and having electronic elements mounted thereon, means connecting said elongated base plates end-to-end and through which said electronic elements are connected to form a circuit, and means connecting said circuit to said image pick-up element at an end of one of said elongated base plates and to said connector means at an end of another of said elongated base plates; and
means for supporting the video camera having a mounting bracket including a base portion having an upstanding part extending therefrom and terminating in a laterally directed extension at right angles thereto, a clamping member having right angularly related arms with a flange extending from an end of one of said arms, said flange and said upstanding part having aligned holes, and screws engageable in said aligned holes for securing said clamping member to said mounting bracket with said panels of the outer casing engaged by said upstanding part and said laterally directed extension and by said arms, respectively.

25. A video camera as in claim 24; in which at least one of said arms has a locating pin extending therefrom to engage in said socket of the one of said panels engaged by said one arm.

26. A video camera as in claim 24; in which at least one of said electronic elements has a rotable adjustment member with a slotted head, and said outer casing has an opening providing access to said slotted head; and further comprising an adjustment tool having a blade-like end portion dimensioned to extend into engagement with said slotted head through said opening providing access thereto, and a cross-piece extending transversely in respect to said blade-like end portion and engageable with the outer surface of said casing for limiting the insertion of said tool.

27. A video camera as in claim 26; in which said cross-piece has a plastic covering thereon to prevent scarring of said outer surface of the casing thereby.

28. A video camera as in claim 26; in which blade-like end portion is at one end of a continuous length of rigid wire which includes two parallel spaced apart straight portions connected at one end by a bight portion to provide a handle with said blade-like end portion extending longitudinally from the other end of one of said straight portions and said cross-piece extending laterally from the other end of the other of said straight portions and intersecting said one straight portion.

29. A video camera as in claim 28; in which said base portion of the mounting bracket has an elevated boss thereon; and in which the distance between said spaced apart straight portions of the adjustment tool is selected to resiliently retain said tool with one of said straight portions between said flange and said one arm of said clamping member and the other of said straight portions urged against said boss on said base portion.

* * * * *